United States Patent
Lin

(10) Patent No.: US 9,054,289 B2
(45) Date of Patent: Jun. 9, 2015

(54) LIGHT-EMITTING DIODE PACKAGE AND METHOD FOR MANUFACTURING THE SAME

(71) Applicant: LEXTAR ELECTRONICS CORPORATION, Hsinchu (TW)

(72) Inventor: Ching-Yao Lin, New Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/273,490

(22) Filed: May 8, 2014

(65) Prior Publication Data

US 2015/0115308 A1   Apr. 30, 2015

(30) Foreign Application Priority Data

Oct. 28, 2013   (TW) .............................. 102138851 A

(51) Int. Cl.
*H01L 33/48* (2010.01)
*H01L 33/62* (2010.01)

(52) U.S. Cl.
CPC ......... *H01L 33/62* (2013.01); *H01L 2933/0066* (2013.01)

(58) Field of Classification Search
CPC ....... H01L 33/48–33/648; H01L 24/10–24/17; H01I 24/42–24/49
USPC ........... 257/98, 99, 59; 438/26; 361/103, 760, 361/767
See application file for complete search history.

(56) References Cited

U.S. PATENT DOCUMENTS

| | | | |
|---|---|---|---|
| 8,120,049 B2 * | 2/2012 | Matsuo et al. | 257/98 |
| 2010/0006881 A1 * | 1/2010 | Seo et al. | 257/98 |
| 2010/0140636 A1 * | 6/2010 | Donofrio et al. | 257/98 |
| 2010/0163907 A1 * | 7/2010 | Hsu et al. | 257/98 |
| 2010/0220454 A1 * | 9/2010 | Koga | 361/767 |
| 2012/0080703 A1 * | 4/2012 | Lin | 257/98 |
| 2012/0248408 A1 * | 10/2012 | Paek et al. | 257/13 |
| 2012/0275128 A1 * | 11/2012 | Takada et al. | 361/760 |
| 2013/0032805 A1 * | 2/2013 | Kim et al. | 257/59 |
| 2013/0063854 A1 * | 3/2013 | Soffer | 361/103 |

* cited by examiner

*Primary Examiner* — Kenneth Parker
*Assistant Examiner* — Young W Kim

(57) ABSTRACT

The present disclosure provides a light-emitting diode package, including: a carrier; a light-emitting diode chip disposed over the carrier and electrically connected to the carrier, wherein the light-emitting diode chip includes at least two recesses at corners located on a diagonal line of the light-emitting diode chip; a eutectic layer disposed between the light-emitting diode chip and the carrier, wherein the eutectic layer includes at least two metal pillars embedded into the at least two recesses respectively, wherein an upper portion of the metal pillars covers a portion of a top surface of the light-emitting diode chip. The present disclosure also provides a method for manufacturing a light-emitting diode package.

12 Claims, 10 Drawing Sheets

LIGHT-EMITTING DIODE PACKAGE AND METHOD FOR MANUFACTURING THE SAME

CROSS REFERENCE TO RELATED APPLICATIONS

This application claims priority of Taiwan Patent Application No. 102138851, filed on Oct. 28, 2013, the entirety of which is incorporated by reference herein.

BACKGROUND

1. Technical Field

The disclosure relates to a light-emitting diode package and a method for manufacturing the same, and in particular to a light-emitting diode package having metal pillars and a method for manufacturing the same.

2. Description of the Related Art

A light-emitting diode has a P/N junction, and the light-emitting diode may emit light when electric voltage is applied to the P/N junction. The light-emitting diode is widely used in various applications such as indicators, shop signs, illumination and other illumination devices. Since the light-emitting diode (LED) has advantages such as small volume, long lifetime, low power consumption and high brightness, the light-emitting diode is gradually replacing the conventional light bulb and becoming the most important illumination device in use today.

In the packaging process of light-emitting diodes, the eutectic bonding process is a common die attach method. In the eutectic bonding process, eutectic metal is formed on the surface of the light-emitting diode chip or the surface of the carrier, then the light-emitting diode chip and the carrier are eutectically bonded. Then, the eutectic bonding process is completed by heating. However, in the heating process, the light-emitting diode chip may easily shift or rotate, resulting in failure of the eutectic bonding process or resulting in an electrical shortage or a broken circuit. In the conventional process, the light-emitting diode chip is pressed in the eutectic bonding process to solve the above issues and increase the yield. However, the pressing process will increase the manufacturing complexity and the cost and decrease the throughput.

Therefore, a method for manufacturing the light-emitting diode package with simplicity, cost-effectiveness, high throughput, which may prevent the light-emitting diode chip from shifting or rotating in the heating process, is needed.

SUMMARY

The present disclosure provides a light-emitting diode package, including: a carrier; a light-emitting diode chip disposed over the carrier and electrically connected to the carrier, wherein the light-emitting diode chip includes at least two recesses at corners located on a diagonal line of the light-emitting diode chip; a eutectic layer disposed between the light-emitting diode chip and the carrier, wherein the eutectic layer includes at least two metal pillars embedded into the at least two recesses respectively, wherein an upper portion of the metal pillars covers a portion of a top surface of the light-emitting diode chip.

The present disclosure also provides a method for manufacturing a light-emitting diode package, including: providing a light-emitting diode chip; forming a eutectic layer over the light-emitting diode chip; forming a recess at at least one corner of the light-emitting diode chip; providing a carrier, wherein at least one metal pillar corresponding to the recess is formed over the carrier; eutectically bonding the light-emitting diode chip to the carrier by the eutectic layer, wherein the light-emitting diode chip is electrically connected to the carrier, and wherein the metal pillar is embedded into the recess; melting the metal pillar by heating such that an upper portion of the metal pillar covers a portion of a top surface of the light-emitting diode chip.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
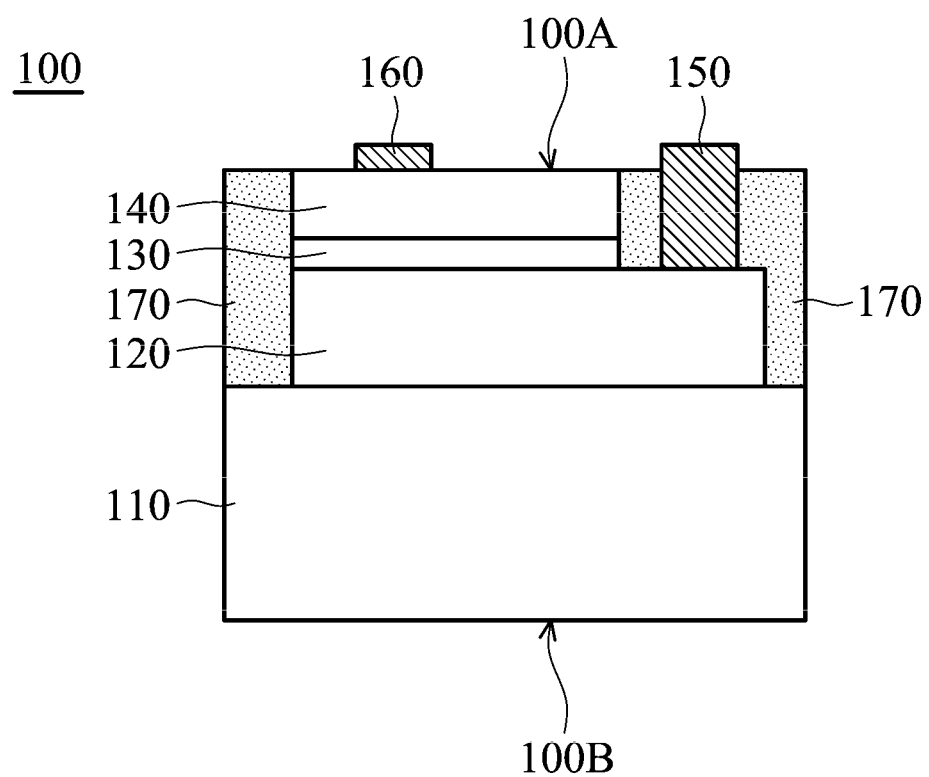
FIG. 1 is a cross-sectional view of a light-emitting diode chip in accordance with some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers. It is noted that in the accompanying drawings, like and/or corresponding elements are denoted to by like reference numerals.

In this specification, relative expressions are used. For example, "lower", "bottom", "higher" or "top" are used to describe the position of an element relative to another. It should be appreciated that if a device is flipped upside down, an element at a "lower" side will become an element at a "higher" side.

The terms "about" and "substantially" typically means +/−20% of the stated value, more typically +/−10% of the stated value and even more typically +/−5% of the stated value. The stated value of the present disclosure is an approximate value. When there is no specific description, the stated value includes the meaning of "about" or "substantially".

The method for manufacturing the light-emitting diode package provided in the present disclosure embeds the metal pillar on the carrier into the recess of the light-emitting diode chip to prevent the light-emitting diode chip from shifting or rotating in the heating process of the packaging process.

First, referring to FIG. 1, a light-emitting diode chip 100 is provided. The light-emitting diode chip 100 includes an ultraviolet (UV) light-emitting diode chip, blue light-emitting diode chip, green light-emitting diode chip, red light-emitting diode chip or any other suitable light-emitting diode chips.

In some embodiments of the present disclosure, as illustrated in FIG. 1, the light-emitting diode chip 100 includes a substrate 110, a first semiconductor layer 120 over the substrate 110, an active layer 130 over the first semiconductor layer 120, a second semiconductor layer 140 over the active layer 130, a first electrode 150 over the portion of the first semiconductor layer 120 not covered by the active layer 130, a second electrode 160 over the second semiconductor layer 140 and a protective layer 170 on the sidewalls and the surface 100A of the light-emitting diode chip 100. The light-emitting diode chip 100 includes a surface 100A and a surface 100B, and the surface 100A and the surface 100B are opposite to each other. Note that the description above is merely for illustration, the light-emitting diode chip 100 may also be other structures.

The first semiconductor layer 120 has a first conductive type, while the second semiconductor layer 140 has a second conductive type different from the first conductive type. The first semiconductor layer 120 and the second semiconductor layer 140 are different, and may independently include doped or undoped $In_xAl_yGa_{(1-x-y)}N$, wherein $0 \leq x \leq 1$, $0 \leq y \leq 1$ and $0 \leq (x+y) \leq 1$. For example, the first semiconductor layer 120 and the second semiconductor layer 140 may independently include doped or undoped GaN, InN, AlN, $In_xGa_{(1-x)}N$, $Al_xIn_{(1-x)}N$, $Al_xIn_yGa_{(1-x-y)}N$ or any other suitable materials, wherein $0 \leq x \leq 1$, $0 \leq y \leq 1$ and $0 \leq (x+y) \leq 1$.

The active layer 130 is disposed between the first semiconductor layer 120 and the second semiconductor layer 140. The active layer 130 includes homojunction, heterojunction, single-quantum well (SQW), multiple-quantum well (MQW) or any other suitable structures. In some embodiments of the present disclosure, the active layer 130 includes undoped N-type $In_xGa_{(1-x)}N$. In some embodiments of the present disclosure, the active layer 130 includes other materials such as $Al_xIn_yGa_{(1-x-y)}N$. In addition, the active layer 130 includes a multiple-quantum well structure with multiple-quantum layers (such as InGaN) and barrier layers (such as GaN) arranged alternately.

The first electrode 150 and the second electrode 160 may be single-layer or multiple-layer of Au, Cr, Ni, Pt, Ti, Al, Ir, Rh, a combination thereof, or other metal materials with good conductivity.

The protective layer 170 includes a silicon oxide layer, silicon nitride layer, silicon oxynitride layer, any other suitable insulating layers or a combination thereof. The protective layer 170 electrically isolates the light-emitting diode chip 100 from the subsequent metal pillar. In addition, in some embodiments of the present disclosure, as illustrated in FIG. 1, the first electrode 150 and the second electrode 160 protrude from the protective layer 170.

Figure 2A:
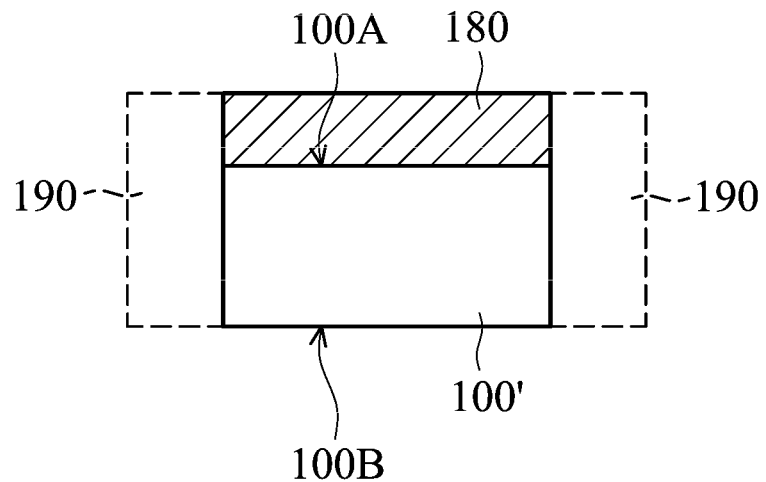
FIGS. 2A-6B are cross-sectional views or top views of a light-emitting diode package at various manufacturing stages in accordance with some embodiments of the present disclosure.

Next, as illustrated in FIG. 2A, a eutectic layer 180 is formed over the surface 100A of the light-emitting diode chip 100. The eutectic layer 180 includes Au, Cu, Bi, Ag, Zn, Ti, Ni, Pt, Rh, Al, In or Sn or alloys thereof. For example, in some embodiments of the present disclosure, the eutectic layer 180 may be AuSn alloy, AuCu alloy, SnCu alloy, SnBi alloy, SnNi alloy, SnAgCu alloy or SnNiCu alloy. The eutectic layer 180 may be formed by electroplating, sputtering, resistive thermal evaporation, electron beam evaporation or any other suitable deposition processes.

Figure 2B:
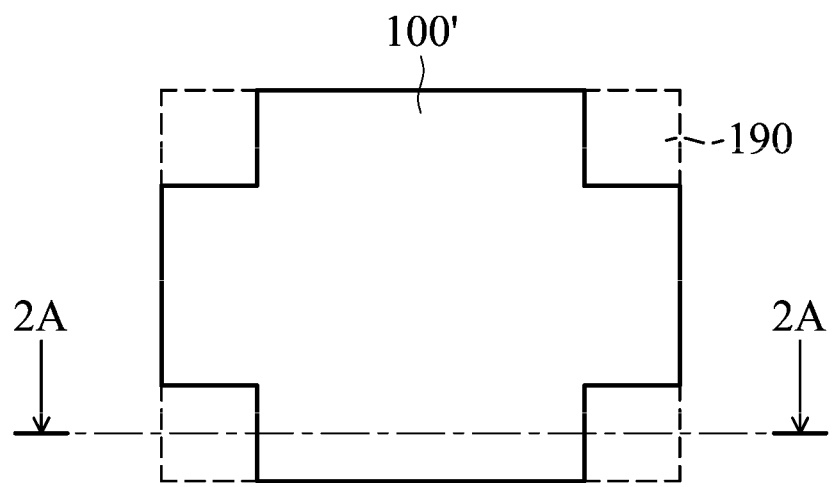

Next, referring to the cross-sectional view of FIG. 2A and the top view of FIG. 2B, a recess 190 is formed at the corner of the light-emitting diode chip 100, wherein FIG. 2A is the cross-sectional view along line 2A-2A of FIG. 2B. In the specification, the light-emitting diode chip having the recesses 190 is referred to as the light-emitting diode chip 100'. The recesses 190 may be formed by mechanical drilling, laser cutting, wet etching, dry etching or any other suitable methods. The recesses 190 completely cut through the light-emitting diode chip 100' and the eutectic layer 180. The recesses 190 may be engaged with the subsequent metal pillars to prevent the light-emitting diode chip 100' from shifting or rotating in the subsequent heating process, which in turn, reduces or eliminates the failure of the eutectic bonding process or prevents the electrical shortage or the broken circuit.

The area of the recesses 190 is about 1%-5% of the total area of the light-emitting diode chip 100' and the recesses 190, for example, about 1%-3%. In some embodiments of the present disclosure, the eutectic layer 180 is formed before the recesses 190. However, in other embodiments of the present disclosure, the eutectic layer 180 is formed after the recesses 190. Note that although FIGS. 2A and 2B merely illustrate the recesses 190 formed at four corners of the light-emitting diode chip 100', the recesses 190 may be formed at part of the corners of the light-emitting diode chip 100' and may be other shapes.

Figure 3A:
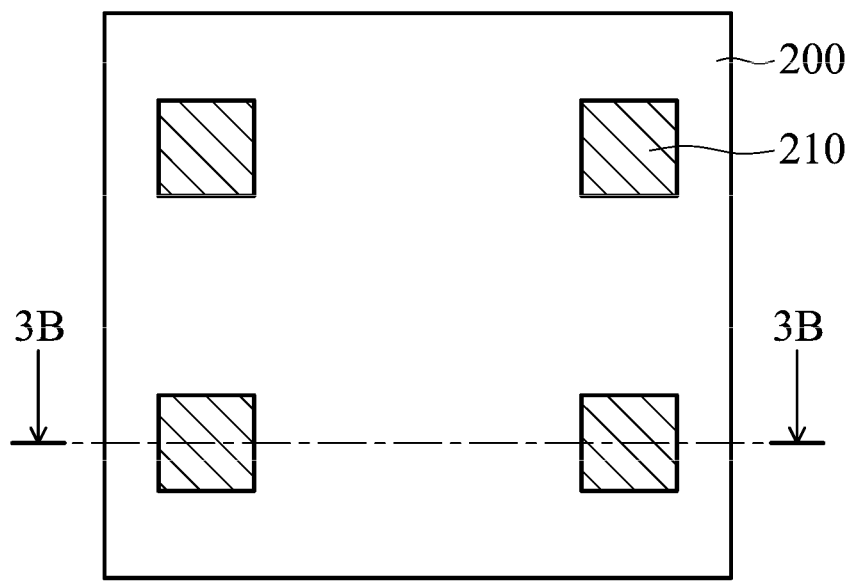
Figure 3B:
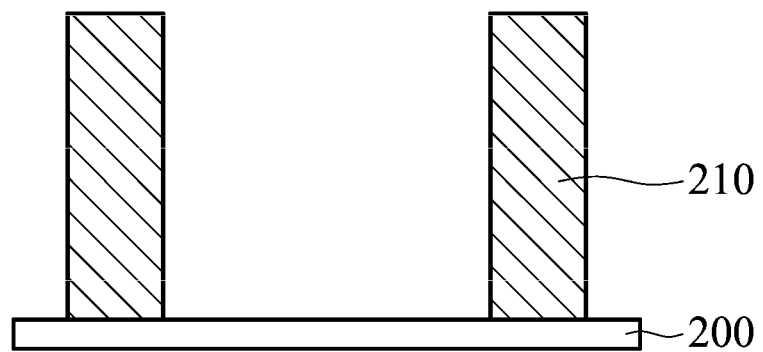

Referring to FIGS. 3A-3B, a carrier 200 is provided, wherein FIG. 3B is the cross-sectional view along line 3B-3B of FIG. 3A. The carrier 200 includes a circuit board or a lead frame. Metal pillars 210 are formed over the carrier 200 corresponding to the recesses 190. Metal pillars 210 are higher than the total height of the light-emitting diode chip 100' and the eutectic layer 180. The metal pillars 210 may be Au, Cu, Bi, Ag, Zn, Ti, Ni, Pt, Rh, Al, In or Sn or alloys thereof. In some embodiments of the present disclosure, the metal pillars 210 may be AuSn alloy, AuCu alloy, SnCu alloy, SnBi alloy, SnNi alloy, SnAgCu alloy or SnNiCu alloy. The metal pillars 210 may be formed by depositing a metal material on the carrier 200, then patterning the metal material by lithography and etching processes. Alternatively, the metal pillars 210 may be formed by a lift-off method or a printing process. The aforementioned depositing process may be electroplating, sputtering, resistive thermal evaporation, electron beam evaporation or any other suitable deposition processes. Note that although FIGS. 3A and 3B merely illustrate four metal pillars 210 corresponding to the four corners of the light-emitting diode chip 100', the number of the metal pillars 210 may be from one to three and the metal pillars 210 may only correspond to part of the corners of the light-emitting diode chip 100' and may be other shapes.

Figure 4:
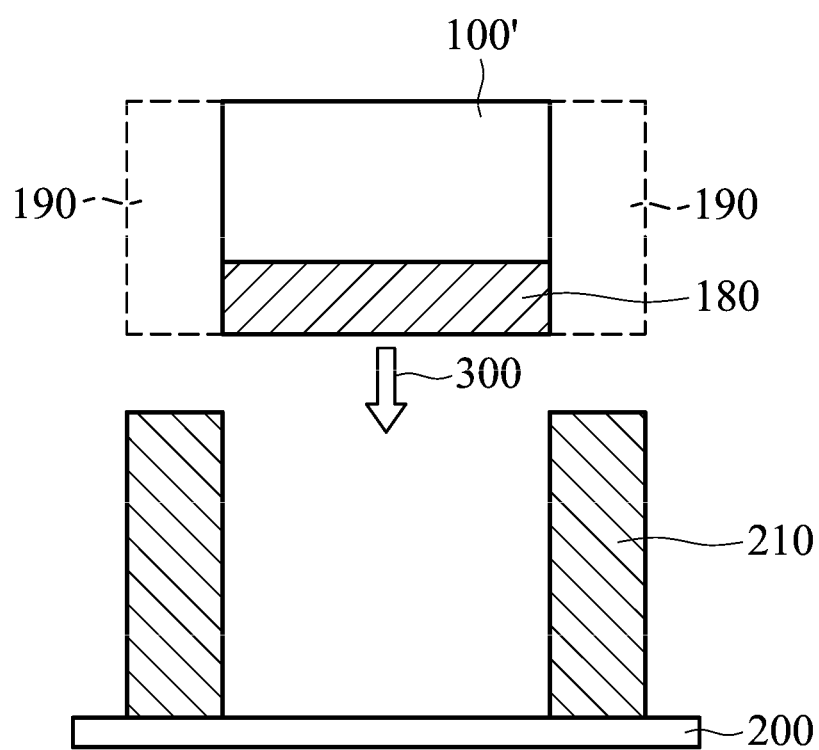

Next, as illustrated in FIG. 4, a eutectic bonding process 300 is performed to eutectically bond the light-emitting diode chip 100' to the carrier 200, wherein the eutectic layer 180 faces toward the carrier 200 and the light-emitting diode chip 100' is electrically connected to the carrier 200.

Figure 5A:
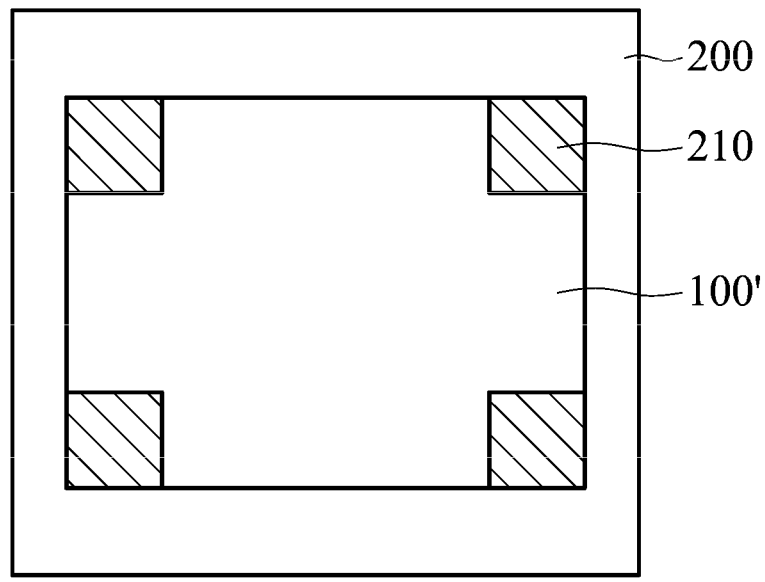
Figure 5B:
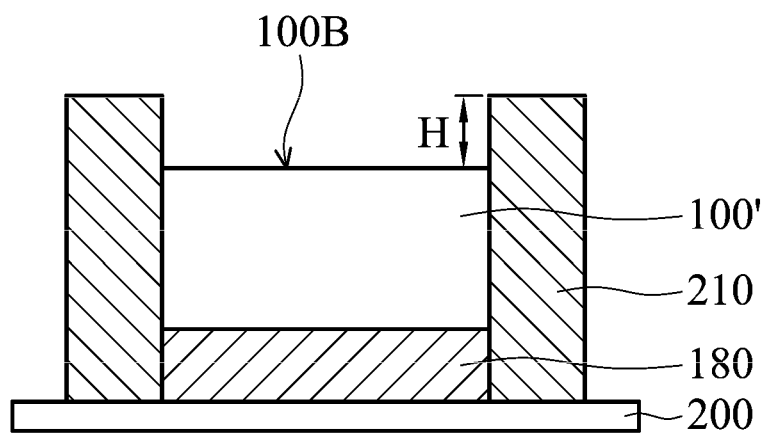

The light-emitting diode chip 100' and the carrier 200 after the eutectic bonding process are shown in FIGS. 5A and 5B, wherein FIG. 5B is the cross-sectional view along line 5B-5B of FIG. 5A. As illustrated in the figures, each of the metal pillars 210 is engaged with the corresponding recess 190. The metal pillars 210 are higher than the surface 100B of the light-emitting diode chip 100' with a height H from about 30 μm to 400 μm, for example, about 50 μm to 200 μm. Note that although the shape of the metal pillar 210 is the same with the recess 190 in FIGS. 5A and 5B, the shape of the metal pillar 210 may be different from the recess 190 in other embodiments of the present disclosure. The only requirement is that the metal pillar 210 is engaged with the recess 190.

Since the metal pillar 210 is embedded into the recess 190 of the light-emitting diode chip 100', the shifting or rotation of the light-emitting diode chip 100' in the subsequent heating process is prevented, which in turn, reduces or eliminates the failure of the eutectic bonding process or prevents the electrical shortage or the broken circuit. In addition, the method for manufacturing the light-emitting diode package in the present disclosure omits the pressing process in the conventional packaging process to simplify the manufacturing processes, reduce the cost and increase the throughput.

Figure 6A:
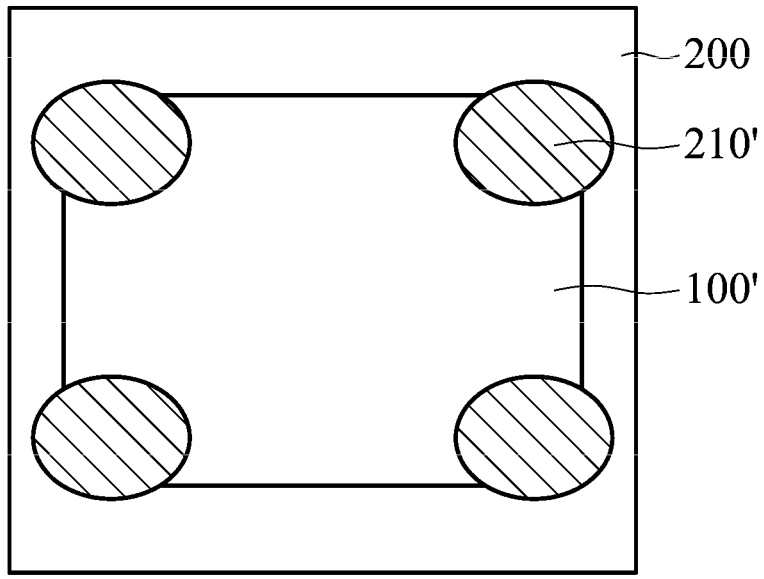
Figure 6B:
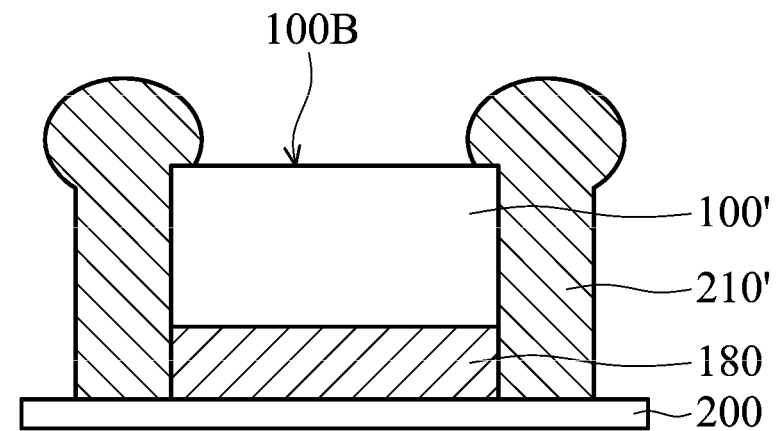
Figure 7A:
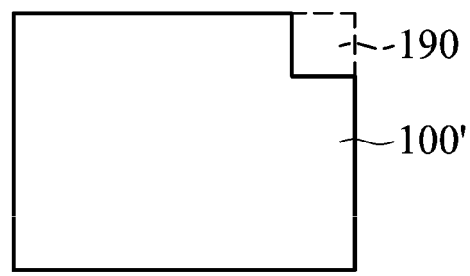
FIGS. 7A-8 are top views of a light-emitting diode chip having a recess in accordance with other embodiments of the present disclosure.
Figure 7B:
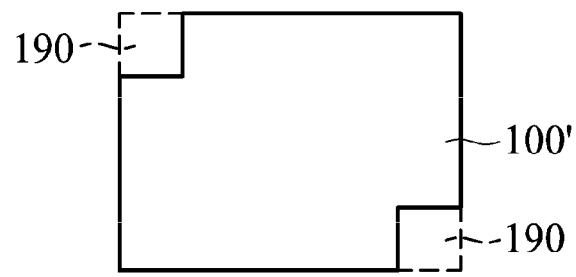
Figure 7C:
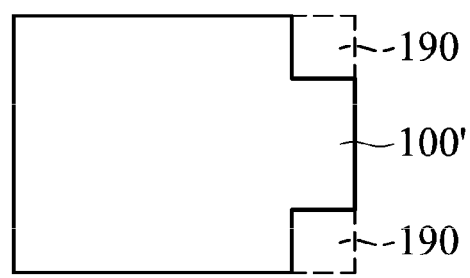
Figure 7D:
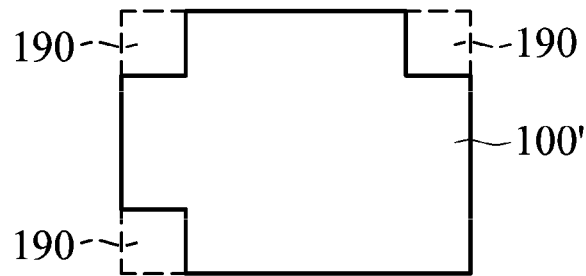

Next, as illustrated in FIGS. 6A-6B, a heating process is performed to melt the metal pillar 210 to complete the light-emitting diode package 400. The temperature of the heating process may range from about 100° C. to 500° C., for example, from about 150° C. to 400° C. The melted metal pillar is referred to as the metal pillar 210'. Since the metal pillar 210 is higher than the surface 100B of the light-emitting diode chip 100', the upper portion of the melted metal pillar 210' covers a portion of the top surface 100B of the light-emitting diode chip 100'. Note that although the top portion of the metal pillar 210' is circular in FIG. 6A, the top portion of the metal pillar 210' may have any shape and is not limited to the aforementioned embodiments. In addition, since the metal pillar 210', which covers a portion of the top surface 100B of the light-emitting diode chip 100', also exerts pressure on the light-emitting diode chip 100', the method for manufacturing the light-emitting diode package provided in the present disclosure also has the pressing effect as the conventional packaging process although the conventional pressing process is omitted.

FIGS. 7-11 illustrate other configurations of the recess and the metal pillar. FIGS. 7A-7D illustrate the recesses 190 may be merely formed at part of the corners of the light-emitting diode chip 100'. As illustrated in FIG. 7A, one recess 190 is formed at one corner of the light-emitting diode chip 100'. Alternatively, as illustrated in FIG. 7B, two recesses 190 are formed at two corners located on the diagonal line of the light-emitting diode chip 100'. As another alternative, as illustrated in FIG. 7C, two recesses 190 are formed at two corners located on the same side of the light-emitting diode chip 100'. As another alternative, as illustrated in FIG. 7D, three recesses 190 are formed at three corners of the light-emitting diode chip 100'.

Figure 8:
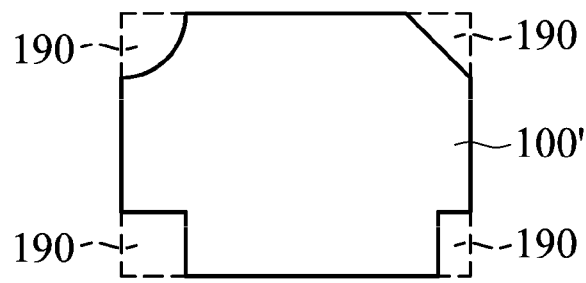

In addition, FIG. 8 illustrates other shapes of the recess 190 other than a square. As illustrated in FIG. 8, the recess 190 may be a rectangle, a triangle or a fan-shape.

Figure 9A:
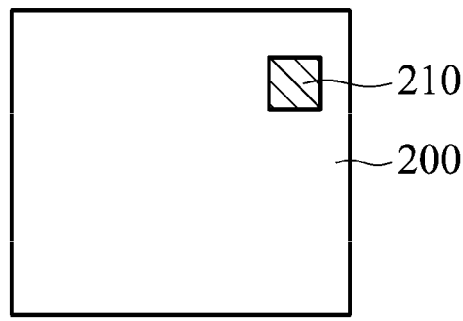
FIGS. 9A-10 are top views of a carrier and a metal pillar in accordance with other embodiments of the present disclosure.
Figure 9B:
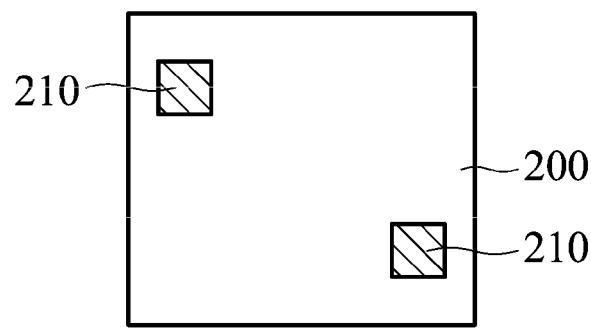
Figure 9C:
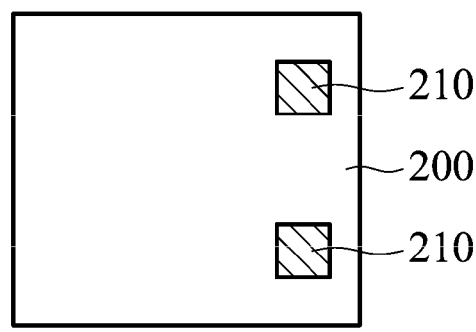
Figure 9D:
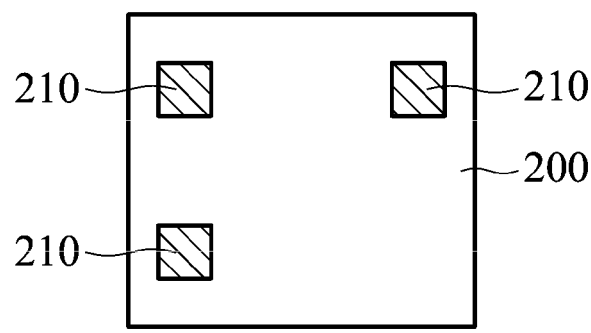

FIGS. 9A-9D illustrate one to three metal pillars 210 may be formed corresponding to part of the corners of the light-emitting diode chip 100'. As illustrated in FIG. 9A, one metal pillar 210 is formed corresponding to one corner of the light-emitting diode chip 100'. Alternatively, as illustrated in FIG. 9B, two metal pillars 210 are formed corresponding to two corners located on the diagonal line of the light-emitting diode chip 100'. As another alternative, as illustrated in FIG. 9C, two metal pillars 210 are formed corresponding to two corners located on the same side of the light-emitting diode chip 100'. As another alternative, as illustrated in FIG. 9D, three metal pillars 210 are formed corresponding to three corners of the light-emitting diode chip 100'.

Figure 10:
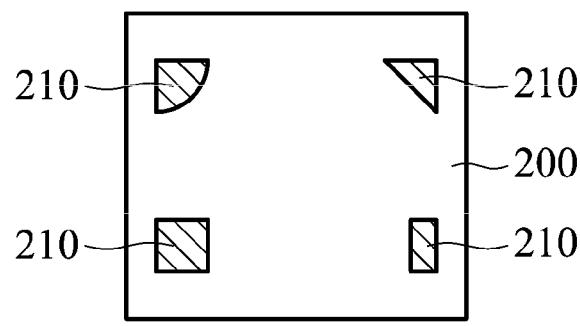

Moreover, FIG. 10 illustrates other shapes of the metal pillar 210 other than a square. As illustrated in FIG. 10, the metal pillar 210 may be a rectangle, a triangle or a fan-shape.

FIGS. 8 and 10 also illustrate each of the recess 190 and metal pillar 210 may have different sizes and shapes.

Figure 11A:
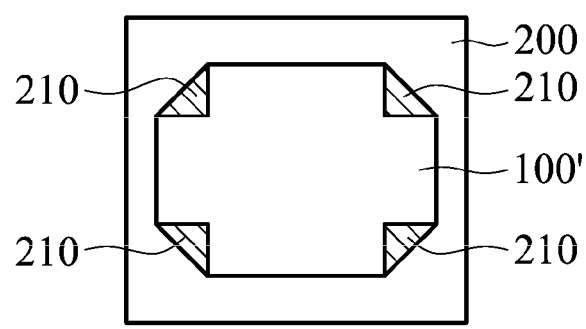
FIGS. 11A-11B are top views of a metal pillar embedded into a recess in accordance with other embodiments of the present disclosure.
Figure 11B:
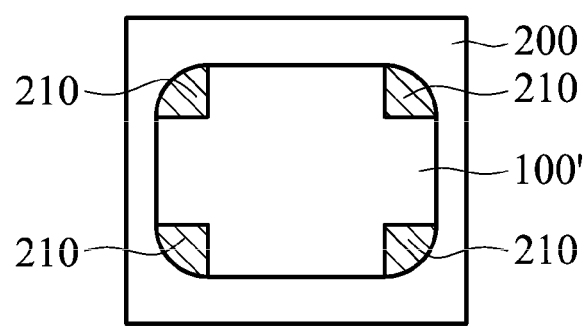

In addition, FIGS. 11A-11B illustrate the shape of the metal pillar 210 may be different from the recess 190. As illustrated in FIG. 11A, triangular metal pillar 210 is engaged with the squared recess 190. Alternatively, as illustrated in FIG. 11B, fan-shaped metal pillar 210 is engaged with the squared recess 190. Therefore, the only requirement is that the metal pillar 210 is engaged with the recess 190. The shape of the metal pillar 210 does not need to be the same with the recess 190.

In summary, the present disclosure embeds the metal pillar into the recess of the light-emitting diode chip to prevent the light-emitting diode chip from shifting or rotating in the subsequent heating process, which in turn, reduces or eliminates the failure of the eutectic bonding process or prevents the electrical shortage or the broken circuit. Moreover, the method for manufacturing the light-emitting diode package in the present disclosure omits the pressing process in the conventional packaging process to simplify the manufacturing processes, reduce the cost and increase the throughput.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A light-emitting diode package, comprising:
   a carrier;
   a light-emitting diode chip disposed over the carrier and electrically connected to the carrier, wherein the light-emitting diode chip comprises at least two recesses at corners located on a diagonal line of the light-emitting diode chip;
   a eutectic layer disposed between the light-emitting diode chip and the carrier, wherein the eutectic layer comprises at least two metal pillars embedded into the at least two recesses respectively, wherein an upper portion of the metal pillars covers a portion of a top surface of the light-emitting diode chip.

2. The light-emitting diode package as claimed in claim 1, wherein the light-emitting diode chip comprises a protective layer disposed on sidewalls and the top surface of the light-emitting diode chip, such that the light-emitting diode chip is electrically isolated from the metal pillars.

3. The light-emitting diode package as claimed in claim 1, wherein the carrier comprises a circuit board or a lead frame.

4. The light-emitting diode package as claimed in claim 1, wherein materials of the eutectic layer and the metal pillars are independently selected from the group consisting of Au, Cu, Bi, Ag, Zn, Ti, Ni, Pt, Rh, Al, In or Sn or alloys thereof.

5. The light-emitting diode package as claimed in claim 4, wherein the alloys comprise AuSn alloy, AuCu alloy, SnCu alloy, SnBi alloy, SnNi alloy, SnAgCu alloy or SnNiCu alloy.

6. The light-emitting diode package as claimed in claim 1, wherein a shape of the recesses comprises a square, a rectangle, a triangle or a fan-shape.

7. The light-emitting diode package as claimed in claim 6, wherein a shape of the metal pillars comprises a square, a rectangle, a triangle or a fan-shape.

8. The light-emitting diode package as claimed in claim 1, wherein an area of the recesses is 1%-5% of a total area of the light-emitting diode chip and the recesses.

9. The light-emitting diode package as claimed in claim 1, wherein the metal pillars are higher than the light-emitting diode chip by 50 μm-200 μm.

10. A method for manufacturing a light-emitting diode package, comprising:

providing a light-emitting diode chip;

forming a eutectic layer over the light-emitting diode chip;

forming a recess at at least one corner of the light-emitting diode chip;

providing a carrier, wherein at least one metal pillar corresponding to the recess is formed over the carrier;

eutectically bonding the light-emitting diode chip to the carrier by the eutectic layer, wherein the light-emitting diode chip is electrically connected to the carrier, and the metal pillar is embedded into the recess;

melting the metal pillar by heating such that an upper portion of the metal pillar covers a portion of a top surface of the light-emitting diode chip.

11. The method for manufacturing the light-emitting diode package as claimed in claim 10, wherein the forming of the recess comprises laser cutting, wet etching or dry etching.

12. The method for manufacturing the light-emitting diode package as claimed in claim 10, wherein before the forming of the eutectic layer over the light-emitting diode chip, further comprising:

forming a protective layer on sidewalls and the top surface of the light-emitting diode chip.

* * * * *